United States Patent [19]
Tsuchida et al.

[11] Patent Number: 5,244,708
[45] Date of Patent: Sep. 14, 1993

[54] ELECTROMAGNETIC WAVE SHIELDING INTERIOR MATERIAL

[75] Inventors: Yasuyoshi Tsuchida; Ryoichi Isoyama; Kazumasa Onishi, all of Tokyo; Teruo Matsui, Yokomaha, all of Japan

[73] Assignees: Fujita Corporation; ABC Trading Co., Ltd., both of Tokyo, Japan

[21] Appl. No.: 675,256

[22] Filed: Mar. 27, 1991

[30] Foreign Application Priority Data

Mar. 28, 1990 [JP] Japan .................................. 2-80222

[51] Int. Cl.⁵ .................................. B32B 3/14
[52] U.S. Cl. .................. 428/77; 174/35 MS; 174/35 R; 428/49; 428/192; 428/195; 428/213; 428/220; 428/421; 428/422; 428/457; 428/463; 428/920; 428/921
[58] Field of Search .............. 428/49, 77, 421, 457, 428/463, 220, 192, 195, 213, 422, 920, 921; 174/35 MS, 35 R; 219/10.55 D; 361/424

[56] References Cited

U.S. PATENT DOCUMENTS

| | | | |
|---|---|---|---|
| 2,321,587 | 6/1943 | Davie | 174/35 MS |
| 3,572,499 | 3/1971 | Mondano | 174/35 MS |
| 4,621,001 | 11/1986 | Bard | 52/388 |
| 4,749,625 | 6/1988 | Obayashi | 174/35 MS |
| 4,750,957 | 6/1988 | Gustafson | 174/35 MS |
| 4,774,148 | 9/1988 | Goto | 428/679 |
| 4,965,408 | 10/1990 | Chapman | 174/35 MS |
| 5,035,940 | 7/1991 | Winton | 428/421 |

FOREIGN PATENT DOCUMENTS

| | | | |
|---|---|---|---|
| 173795 | 3/1986 | European Pat. Off. | 428/421 |
| 99292 | 4/1989 | Japan . | |

Primary Examiner—Ellis P. Robinson
Assistant Examiner—Nasser Ahmad
Attorney, Agent, or Firm—Wenderoth, Lind & Ponack

[57] ABSTRACT

A general-purpose electromagnetic wave shielding interior material having an excellent electromagnetic wave shielding property as well as a good interior finishing property is disclosed. A protective film made of resin is stuck onto one side surface of an electromagnetic wave shielding metal foil, and an incombustible paper sheet is stuck onto the other side surface of the same electromagnetic wave shielding foil to form a laminated sheet having the desired properties. Preferably, the electromagnetic wave shielding metal foil is exposed from the peripheral edge portion of the laminated sheet, and an overlapping margin is reserved at the peripheral edge portion of the laminated sheet.

6 Claims, 2 Drawing Sheets

FREE SURFACE OF SHEET 2 BEING STUCK ONTO WALL SURFACE

ELECTROMAGNETIC WAVE SHIELDING INTERIOR MATERIAL

BACKGROUND OF THE INVENTION

1. Field of the Invention

The present invention relates to an electromagnetic wave shielding interior material which is enabled to obviate hazards pertinent to an electromagnetic wave such as malfunctions of or disturbances against various types of electronic instruments represented by computers caused by an electromagnetic wave, or adverse effects on human bodies of an electromagnetic wave which is especially being given attention in recent years.

2. Description of the Prior Art

A working process for giving an electromagnetic wave shielding property in the scale of a building is applied to an electromagnetic wave shield room for research purpose, medical facilities and the like, and at present a working process of integrating metal sheets by welding is generally used. However, this working process necessitates to carry out interior finishing separately, and so, in the future a working process having general availability which takes finishing property and economy into consideration is required, to say nothing of the above-described field of use, in the use including an inteligent building or a high technique factory for which expansion of demand is expected.

However, in the construction of an electromagnetic wave shield room in the prior art, a construction formed by integrating metal sheets through welding or the like was a common practice, and normally finishing was not especially taken into consideration. And it is the present status that in the case where demand for finishing simultaneously with construction of the electromagnetic wave shielding wall exists, the finishing work is carried out separately.

On the other hand, in the case of paying attention to an interior finish material, the interior finish sheet in the prior art had almost no electromagnetic wave shielding property, and as a method for giving electromagnetic wave shielding property while maintaining finishing property, although practically performed examples are scarce, as a countermeasure, the methods as enumerated in the following (a)-(f) are employed:

(a) application of electrically conductive paint,
(b) metal spraying to a finish material,
(c) metal vapor deposition to a finish material,
(d) mixing of electrically conductive filler into a finish material,
(e) mixing of electrically conductive fibers into a finish material, and
(f) sticking a metal foil to a finish material.

Among the construction methods of an electromagnetic wave shield room in the prior art, the method of integrating metal sheets by welding involved problems in that a finishing property was almost not taken into consideration and a finishing work had to be carried out separately, in view of a term of construction as well as economy.

In addition, with regard to the above-mentioned methods (a)-(f) for giving an electromagnetic wave shielding performance to an interior finish material, according to the methods (a), (b) and (c), faulty portions are liable to be produced in the process of uniformly carrying out painting or vapor deposition, and so, distribution is apt to occur in the electromagnetic wave shielding performance. Also, as to the methods (d) and (e) a considerable amount of mixing is required for the purpose of revealing a predetermined electromagnetic wave shielding performance and moreover it is difficult to make the mixed substance disperse uniformly, resulting in that partly the electromagnetic wave shielding performance is liable to be degraded.

As to the method (f), while a copper foil and an aluminium foil are available as non-ferrous metal, in order to exhibit an electromagnetic wave shielding performance, a thickness thicker than a certain extent becomes necessary, and so, there was a problem in view of its cost as well as its handling. In addition, while an iron foil is excellent in an electromagnetic wave shielding performance as compared to the other non-ferrous metals having an identical thickness, in the case of the conventional rolled iron foil, it is difficult to obtain a uniform thin foil having flexibility, and hence there was a problem in manufacture.

SUMMARY OF THE INVENTION

It is therefore one object of the present invention to provide an electromagnetic wave shielding interior material having a general-purpose utility, which has a uniform electromagnetic wave shielding performance without distribution and moreover has an excellent finishing property, and which is available also for renovation of an existing building.

According to one feature of the present invention, there is provided an electromagnetic wave shielding interior material, wherein a protective film made of resin is stuck onto one side surface of an electromagnetic wave shielding metal foil, and an incombustible paper sheet is stuck onto the other side surface of the same electromagnetic wave shielding metal foil to form a laminated sheet.

As the above-mentioned electromagnetic wave shielding metal foil, an electrolytic iron foil, a rolled iron foil, an aluminium foil or a copper foil can be used. As the protective film made of resin, a film having a self-extinguishing property such as a polyvinylfluoride resin film is available. In addition, an interior of an electromagnetic wave shield room can be made to have a desired design by interposing a print layer between the protective film made of resin and the electromagnetic wave shielding metal foil.

Furthermore, if the electromagnetic wave shielding metal foil is exposed from the peripheral edge portion of the laminated sheet, it is convenient for making adjacent electromagnetic wave shielding metal foils electrically conductive with each other in the case of contiguously arraying the shielding interior materials.

In the case of constructing an electromagnetic wave shield room within a building by making use of the above-described electromagnetic wave shielding interior material according to the present invention, the shield interior material of laminated form has its incombustible paper sheet side stuck onto walls and a ceiling within the building by making use of adhesives with a similar technique to the case of a wallpaper sheet. At this time, in order to insure a predetermined electromagnetic wave shielding performance, the electromagnetic wave shielding metal foils of the adjacent interior materials are made to be electrically conductive with each other by making use of conductive adhesives or an electrically conductive tape. If the electromagnetic wave shielding interior materials are stuck in the above-described manner, then as they include finish materials consisting of a protective film made of resin and a printing layer, both construction of an electromagnetic wave shield and finishing work can be simultaneously completed.

The above-mentioned and other objects, features and advantages of the present invention will become more apparent by reference to the following description of a number of preferred embodiments of the invention taken in conjunction with the accompanying drawings.

DESCRIPTION OF THE PREFERRED EMBODIMENTS

Figure 1:
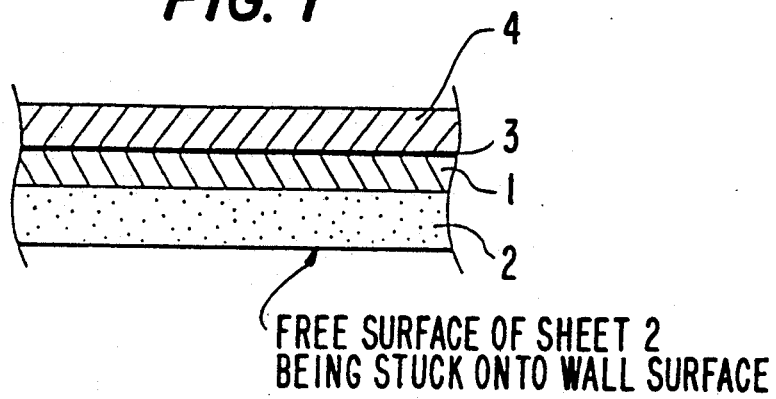
FIG. 1 is a partial cross-section view of an electromagnetic wave shielding interior material.
Figure 2:
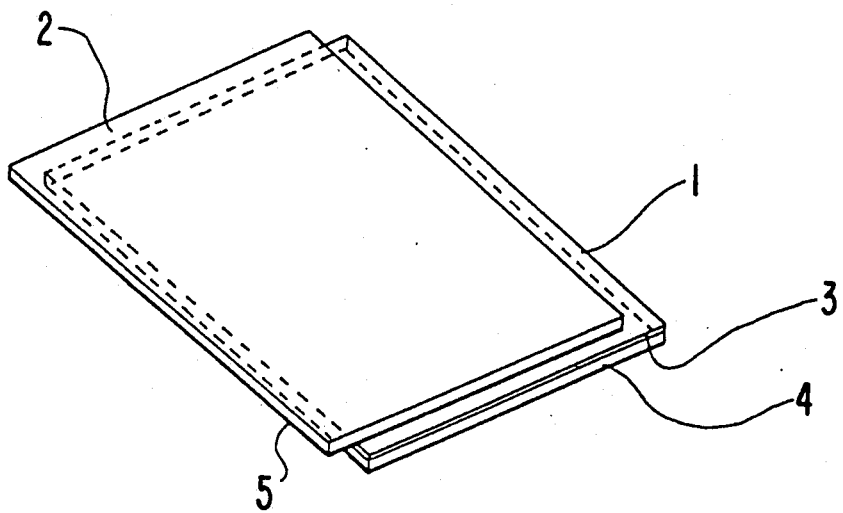
FIG. 2 is a perspective view of the same shielding interior material.

Now, a number of preferred embodiments of the present invention will be described with reference to FIGS. 1 to 3.

An electromagnetic wave shielding interior material is formed into a rectangular laminated sheet by sticking an incombustible paper sheet 2 onto one side surface of an electromagnetic wave shielding metal foil 1 and sticking a protective film 4 made of resin onto the other side surface via a printing layer 4. It is to be noted that the electromagnetic wave shielding interior material is not limited to a rectangular shape but it can be formed in any other shape that can be easily made contiguous.

As the electromagnetic wave shielding metal foil 1, an electrolytic iron foil is desirable, but besides an aluminium foil, a rolled iron foil or a copper foil can be used. In the case of employing an electrolytic iron foil, if its thickness is chosen to be 15-50 μm, it is possible to get an electromagnetic wave shielding performance of 60 dB or higher, and also it is possible to form the entire metal foil in a uniform thickness.

As the protective film 4 made of resin, a film having a self-extinguishing property such as a polyfluoride resin film can be used, and besides a film of, for example, polytetrafluoroethylene (PTFE), tetrafluoroethylene-parafluoroalkylvinylether copolymer (PFA), tetrafluoroethylene-hexafluoropropylene copolymer (FEP), polychlorotrifluoroethylene (PCTFE), tetrafluoroethylene ethylene copolymer (ETFE), chlorotrifluoroethylene-ethylene copolymer (ECTFE), polyvinylidene fluoride (PVDF), polyvinyl fluoride (PVF) or the like is available. And a finish material is formed of the printing layer 3 and the resin protective film 4. A thickness of this resin protective film 4 is chosen to be 10-50 μm, so that it may have a mechanical strength for serving as a surface layer of an inner wall of an electromagnetic wave shield room. It is to be noted that the printing layer 3 is a layer on which a pattern suitable for interior finishing of the inside of an electromagnetic wave shield room is depicted.

The incombustible paper sheet 2 is used for the purpose of enabling the electromagnetic wave shielding interior material to be stuck by adhesion onto walls or a ceiling inside of a building in a similar manner to a wallpaper sheet. To that end, a thickness of this incombustible paper sheet 2 should be preferably about 80-500 μm.

The electromagnetic wave shielding interior material is formed in a rectangular shape, and in the case of sticking a large number of such shielding interior materials onto a wall or the like contiguously to one another, in order to make it possible to insure a predetermined electromagnetic wave shielding performance by making adjacent electromagnetic wave shielding metal foils electrically conductive with one another, a peripheral edge portion of the electromagnetic wave shielding metal foil 1 is expose from the laminated sheet. For instance, as shown in FIG. 2, only the incombustible paper sheet 2 is displaced a little with respect to the electromagnetic wave shielding metal foil 1 along their sticking surface so that two side edge portions of the metal foil 1 may be exposed, and then, at the other two side edge portions, the incombustible paper sheet 2 forms an overlapping margin. In this way, the respective exposed portions of the electromagnetic wave shielding metal foils 1 of the adjacent electromagnetic wave shielding interior materials are overlapped via electrically conductive adhesives or via an electrically conductive double-surface sticking tape, or they are stuck together by means of an electrically conductive joint tape.

Figure 3:
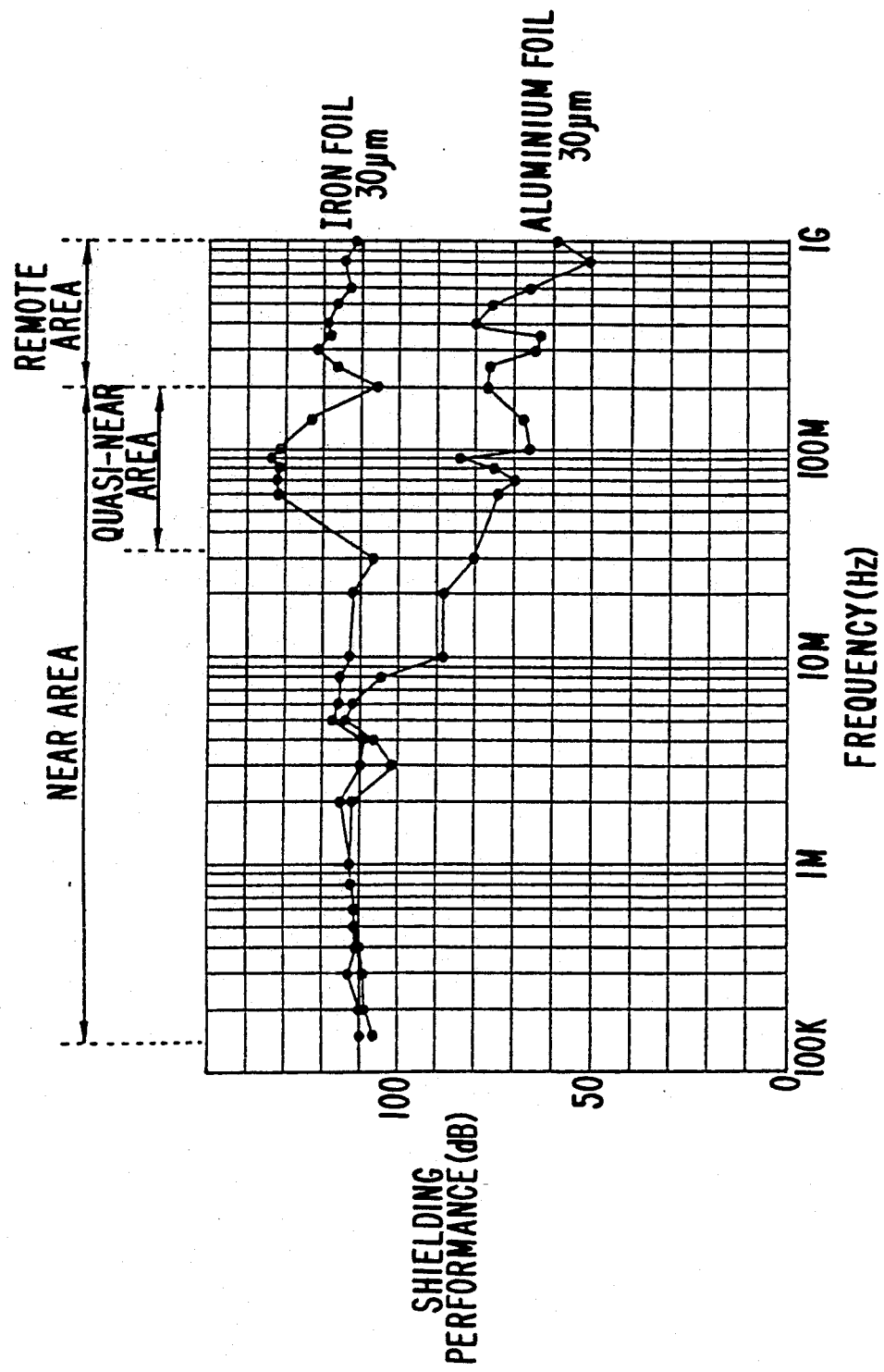
FIG. 3 is a diagram showing one example of measurement for an electromagnetic wave shielding performance.

In the case where an electrolytic iron foil (30 μm in thickness) and an aluminium foil (30 μm in thickness) were used as an electromagnetic wave shielding metal foil in the electromagnetic wave shielding interior material having the above-described construction, an electromagnetic wave shielding performance (dB) was measured while varying the frequency of the electromagnetic wave, and the results of measurement are shown in FIG. 3. As will be seen from FIG. 3, in either case the electromagnetic wave shielding performance (a capability of shielding) was nearly 60 dB or higher, and it has been known that the above-mentioned electromagnetic wave shielding interior material is excellent.

In addition, with respect to preferred embodiments in which a copper foil, an aluminium foil, a rolled iron foil and an electrolytic iron foil were used as the metal foil of the electromagnetic wave shielding interior material having the above-mentioned construction, a shielding performance, a stability of a shielding performance, an adaptability and economy as an interior material were measured, and their evaluation has been shown in Table-1. It is to be noted that the evaluation is indicated by the marks of ⊚, ○, Δ and × in the sequence of from the better one to the worse one. As will be seen from Table-1, in the case of the above-described preferred embodiments, all the evaluation items are satisfactory.

TABLE 1

| Varieties | Electromagnetic Wave Shielding Performance | Stability of Shielding Performance | Adaptability as Interior Material | Economy |
| --- | --- | --- | --- | --- |
| Prior Art | | | | |
| Metal Sheet Welding System | ⊚ | ⊚ | — | x |
| (a) Electrically Conductive Paint | Δ | Δ | — | ⊚ |
| (b) Metal Spraying | Δ | Δ | — | ○ |
| (c) Metal Vapor Deposition | | | | |
| (d) Electrically | Δ | Δ | — | ⊚ |

TABLE 1-continued

| Varieties | Electromagnetic Wave Shielding Performance | Stability of Shielding Performance | Adaptability as Interior Material | Economy |
|---|---|---|---|---|
| Conductive Filler |  |  |  |  |
| (e) Fibers |  |  |  |  |
| Preferred Embodiments |  |  |  |  |
| Metal Foil |  |  |  |  |
| Copper Foil | ∘ | ∘ | ∘ | △ |
| Aluminium Foil | ∘ | ∘ | ⊚ | ∘ |
| Rolled Iron Foil | ⊚ | ∘ | △ | ∘ |
| Electrolytic Iron Foil | ⊚ | ∘ | ⊚ | ∘ |

As will be seen from the detailed description of the preferred embodiments of the present invention above, if the electromagnetic wave shielding interior material according to the present invention is used, despite of the thin thickness of the metal foil, a good electromagnetic wave shielding performance can be obtained, and moreover, the shielding performance would not have partial distribution. In addition, since the electromagnetic wave shielding metal foil is integrally provided with a finish material, construction of an electromagnetic wave shield wall as well as a finishing work can be quickly achieved, also the subject shield interior material is applicable to renovation of an existing building, and so, an economical effect of this invention is excellent.

While a principle of the present invention has been described above in connection to preferred embodiments of the invention, it is intended that all matter contained in the above description and illustrated in the accompanying drawings shall be interpreted to be illustrative and not as a limitation to the scope of the invention.

What is claimed is:

1. Electromagnetic wave shielding interior material for use as an interior finished wall surface, said electromagnetic wave shielding material comprising a laminate of an electrodeposited iron foil having a thickness of 15-50 μm, a self-extinguishing protective resin film adhered over one side surface of said iron foil, and a noncombustible paper sheet adhered over the other side surface of said iron foil, a peripheral portion of a surface of said iron foil that faces towards said resin film being exposed at the periphery of the laminate, and a peripheral portion of the remainder of the laminate exclusive of said iron foil forming a margin at the periphery of the laminate which can be overlapped with a said exposed peripheral portion of an adjacent said laminate.

2. Electromagnetic wave shielding material as claimed in claim 1, and further comprising a printed layer interposed between said resin film and said metal foil.

3. Electromagnetic wave shielding material as claimed in claim 2, wherein said resin film is a polyvinylfluoride resin film.

4. Electromagnetic wave shielding material as claimed in claim 1, wherein said self-extinguishing protective film consists of a polyfluoride resin.

5. Electromagnetic wave shielding material as claimed in claim 4, wherein said resin is selected from the group consisting of polytetrafluoroethylene, tetrafluoroethylene-parafluoroalkylvinylether copolymer, tetrafluoroethylene-hexafluoropropylene copolymer, polychlorotrifluoroethylene, tetrafluoroethylene-ethylene copolymer, chlorotrifluoroethylene-ethylene copolymer, polyvinylidene fluoride, and polyvinyl fluoride.

6. Electromagnetic wave shielding material as claimed in claim 1, wherein said noncombustible paper sheet has a thickness of 80-500 μm.

* * * * *